United States Patent [19]
Proebsting

[11] Patent Number: 6,154,064
[45] Date of Patent: Nov. 28, 2000

[54] DIFFERENTIAL SENSE AMPLIFIER CIRCUIT

[76] Inventor: Robert J. Proebsting, 27800 Edgerton Rd., Los Altos Hills, Calif. 94022

[21] Appl. No.: 09/223,265

[22] Filed: Dec. 30, 1998

[51] Int. Cl.[7] .................................................. G11C 7/06
[52] U.S. Cl. ............................................. 327/55; 327/57
[58] Field of Search ....................... 327/51–57; 365/205, 365/207

[56] References Cited

U.S. PATENT DOCUMENTS

| | | | |
|---|---|---|---|
| 4,871,933 | 10/1989 | Galbraith | 327/52 |
| 4,973,864 | 11/1990 | Nogami | 327/55 |
| 5,231,318 | 7/1993 | Reddy | 327/52 |
| 5,585,747 | 12/1996 | Proebsting | 327/55 |
| 5,894,233 | 4/1999 | Yoon | 327/55 |

Primary Examiner—Toan Tran
Attorney, Agent, or Firm—Skjerven, Morrill, MacPherson, Franklin & Friel

[57] ABSTRACT

A sense amplifier having four NMOS transistors and two resistors is operable at voltage supplies less than 2.5 volts and has a fast response time. The drain terminals of two of the NMOS transistors, each receiving an input voltage signal at its gate terminal, provide a differential output voltage signal across the two resistors. The source terminals of these two NMOS transistors are coupled to the drain and gate terminals of a cross-coupled second pair of NMOS transistors. The amplifier exhibits negative input capacitance at each of its input terminals. The amplifier has a common mode input voltage that is substantially equal to the common mode output voltage, facilitating the cascading of many stages of the amplifier. Each stage of a multi-stage cascade of the amplifiers has a greater than unity voltage gain if driving a low capacitance line or a smaller than unity gain if driving a high capacitance line.

31 Claims, 7 Drawing Sheets

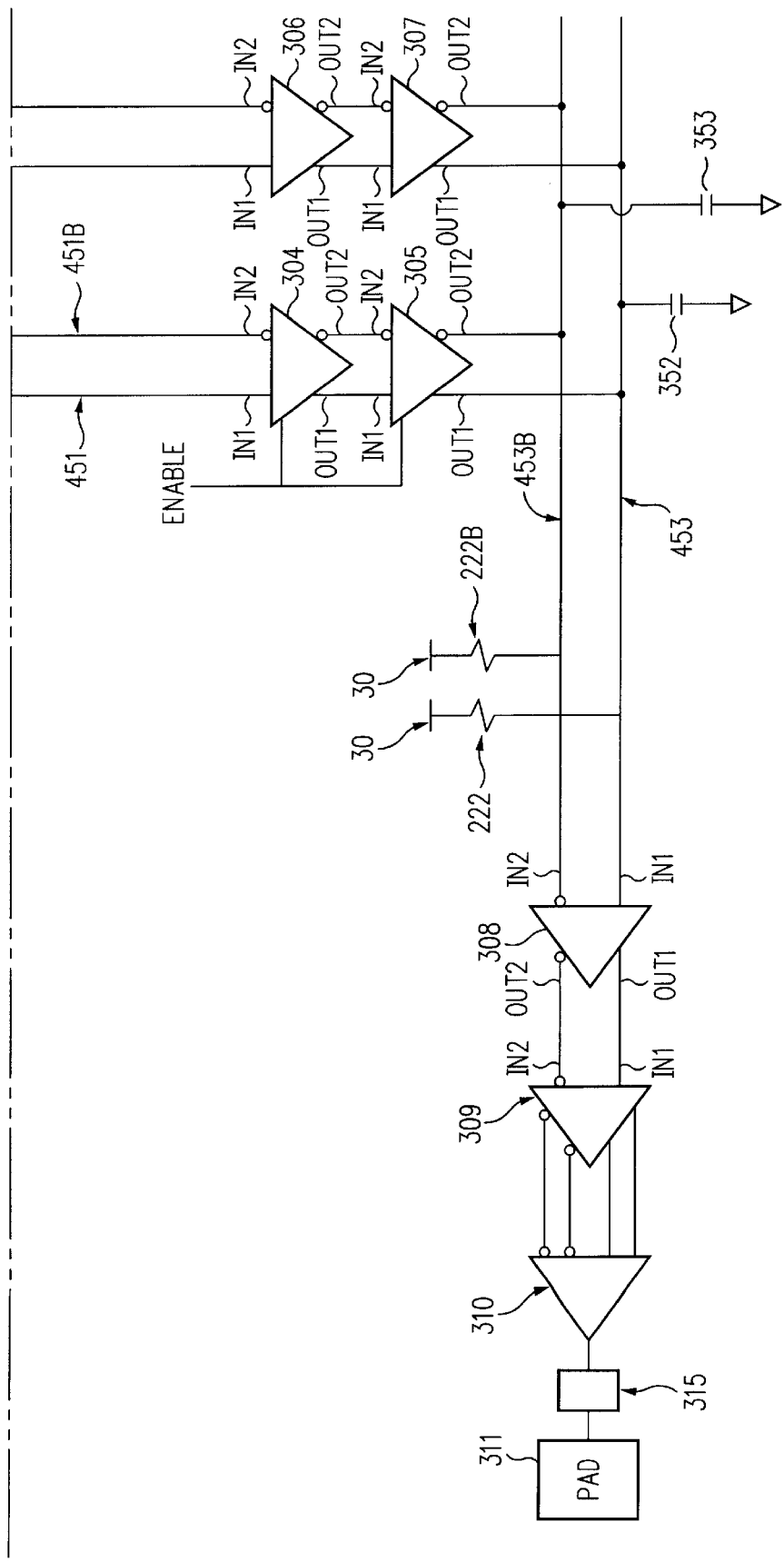

DIFFERENTIAL SENSE AMPLIFIER CIRCUIT

FIELD OF THE INVENTION

The present invention relates to a semiconductor device and, more particularly, to an improved differential sense amplifier for use in a high-performance integrated circuit.

BACKGROUND

Sense amplifiers are widely known in the art and are commonly employed in many types of integrated circuits such as random access semiconductor memory devices containing a plurality of rows and columns of memory cells to detect and amplify the signals that are generated by the memory cells.

To access a particular group of memory cells, i.e. a word, located within a memory array, the addresses of both the row and the columns to which the memory cell group is coupled must first be decoded. For example in a Static Random Access Memory (SRAM) array, each cell in the array is connected to two "bitlines", one the complement of the other. These two bitlines, known as the "true" and "complement" bitlines, together comprise a column, the address of which must be decoded in order to read or write the state of any one cell connected to the column. In high performance random access memories, prior to carrying out a read operation, load resistors or some other mechanism precharges the bitlines so as to equalize the voltages thereon. Thereafter, the memory cell is coupled to the bitlines allowing the current supplied by an SRAM memory cell to modify the bitline voltages. The true and the complement bitlines are, in turn, coupled to the input leads of a sense amplifier which senses the changes in the bitline voltages and in response thereto generates a voltage signal representative of the data stored in the memory cell.

As CMOS processing fabrication technologies improve, Integrated Circuits (ICs) are produced having transistors with thinner gate oxides and ever decreasing channel dimensions. As a result, the maximum allowable voltage supply that can be reliably applied to such ICs decreases. Additionally, as memories become more dense, the current supplied by an SRAM cell to the bitlines in the memory array decreases. This decrease may result in slower charging and discharging of the true and the complement bitlines with an attendant delay in the readout of data from the sense amplifier. Therefore, a high-density, high-performance random access memory must have a sense amplifier which can operate effectively at a small voltage, e.g. 2.5 V, and must minimize the response time to the small differential signals of the array bitlines.

FIG. 1 of commonly invented U.S. Pat. No. 5,585,747, incorporated herein by reference in its entirety, shows a transistor level schematic diagram of a sense amplifier which is very fast and consumes very low power. This amplifier preferably requires a voltage supply exceeding a sum consisting of three transistor threshold voltages plus the differential voltage generated at the output terminals of the amplifier.

As the IC technology advances, device operating voltages decrease faster than the threshold voltages of MOS transistors. As a result, circuits that operate effectively at higher voltage supplies may fail at lower voltage supplies. Therefore a need exists for a sense amplifier which provides a fast response time even when powered by a lower voltage supply.

A sense amplifier often does not generate output voltage signals capable of reaching the limits of a positive and a negative voltage supply. To ensure a fast response time, a sense amplifier often generates a differential output voltage signal that is substantially smaller than the voltage supply. To generate an output voltage signal capable of reaching the voltage supply limits (a rail-to-rail output signal), the differential output voltage of a sense amplifier is typically applied to input terminals of an output amplifier which further amplifies the signal to generate a rail-to-rail output voltage signal.

FIG. 1 illustrates a known two-stage amplifier having a sense amplifier 60 and an output amplifier 70. Sense amplifier 60 receives differential input voltage signals at its input terminals IN1 and IN2 and generates differential output voltage signals at its output terminals OUT1 and OUT2. To provide signal amplification, the ratio of the channel width to the channel length, i.e. W/L (the aspect ratio) of transistors 14 and 15 must be greater than that of transistors 16 and 17, respectively, otherwise sense amplifier 60 does not continuously respond to the changing differential input voltage but instead operates as a latch, latching the positive or negative differential input voltage signal present when signal ENABLE is asserted.

The relatively small differential output voltage generated across output terminals OUT1 and OUT2, e.g. 600 mv, of sense amplifier 60, is subsequently applied to input terminals IN4 and IN3 of output amplifier 70. If the voltage signal applied to input terminal IN3 is greater than that applied to input terminal IN4, the saturated current I3 flowing through transistor 18 exceeds the saturated current I4 flowing through matched transistor 19. Transistor 21 is matched and mirrored to transistor 20 (i.e. transistor 21 has the same size, the same source voltage and the same gate voltage as that of transistor 20) to provide the same saturated current flow through transistor 21 as that through transistor 20 which, in turn, is equal to the current through transistor 18. With the saturated current of transistor 21 therefore exceeding that of transistor 19, the output node OUT switches to a voltage close to that of the positive voltage supply. If, on the other hand, the voltage signal applied to input terminal IN3 is smaller than that applied to input terminal IN4, the saturated current flow through transistors 18, 20 and 21 decreases and that through transistor 19 increases. With the saturated current of transistor 19 exceeding that of transistor 21, terminal OUT is pulled to a voltage slightly above the voltage at the source terminals of transistors 18 and 19, which is near ground. Therefore, the signal at output terminal OUT varies almost from rail-to-rail depending on whether the voltage at terminal IN3 is greater or smaller than that at terminal IN4.

A first disadvantage of output amplifier 70 is that it consumes a relatively high current.

A second disadvantage of output amplifier 70 is that it has a relatively slow response, rendering output amplifier 70 undesirable for use in a data read path of a high speed IC.

SUMMARY

A differential sense amplifier for sensing a differential pair of input voltage signals includes a first, a second, a third and a fourth MOS (Metal Oxide Semiconductor) transistor and a first and a second resistive load. One of the input voltage signals is applied to the gate terminal of the first MOS transistor whose drain terminal is connected to a first output terminal of the sense amplifier. The other input voltage signal is applied to the gate terminal of the second MOS transistor whose drain terminal is connected to a second output terminal of the sense amplifier. A first terminal of the first resistive load is coupled to the first output terminal. A first terminal of the second resistive load is coupled to the second output terminal. A second terminal of each resistive load is coupled to a common node which is coupled to a first voltage supply. The gate and the drain terminals of the third MOS transistor are coupled to the source terminals of the second and first MOS transistors, respectively. The gate and the drain terminals of the fourth MOS transistor are coupled to the source terminals of the first and second MOS transistors, respectively. The source terminals of the second and first transistors provide a third and a fourth output terminal of the sense amplifier which may or may not be coupled to other circuits. The source terminals of both the third and the fourth MOS transistors are coupled to a common node which is coupled to a second voltage supply. The ratio of the channel width to the channel length of the first transistor is greater than that of the third transistor and the ratio of the channel width to the channel length of the second transistor is greater than that of the fourth transistor.

A fifth transistor is optionally coupled between the source terminals of the third and the fourth transistors and the second voltage supply to enable or disable the amplifier. A sixth transistor is optionally coupled between the fifth transistor and the second voltage supply to limit the current drawn by the amplifier.

The amplifier is operable at voltages exceeding a sum of two transistor threshold voltages plus the differential voltage generated between the third and fourth output terminals. Furthermore, the amplifier has a low power consumption and a fast response time.

Both the common mode input voltage and the common mode output voltage of the amplifier—at the first and the second output terminals—are close to the first voltage supply, advantageously, providing for easy cascading of several stages of the amplifier.

The amplifier is well suited for detecting and amplifying the relatively small voltage signals that are generated by a memory cell of a semiconductor memory array. To read the data stored in a memory cell of a memory array, several stages of the amplifier may be cascaded and disposed in various locations in the data read path of the memory array, with each stage providing either a voltage gain or driving a high capacitance global data line. A cascading of several stages of the amplifier in the data read path of a memory array, in accordance with the present invention, therefore advantageously provides voltage gain in some stages and the ability to quickly drive high capacitance loads in other stages to achieve fast read access times and low power consumption.

In some embodiments of the present invention, at least two stages of the amplifier are cascaded to generate differential voltage signals to each of the global vertical I/O (input/output) lines and the global horizontal I/O lines of a memory array, with the first stage providing a greater than unity voltage gain and the second stage providing a fractional voltage gain but driving a relatively large capacitance. The amplifier stages thus cascaded provide a fast response time and consume relatively small current.

In some embodiments of the present invention, an output amplifier includes a first and a second PMOS transistor and a first and a second NMOS transistor. The source terminal of the first PMOS transistor receives a first input voltage signal. The gate and the drain terminals of the first PMOS transistor are coupled to each other. The source terminal of the second PMOS transistor receives a second input voltage signal. The gate terminal of the second PMOS transistor is coupled to the gate terminal of the first PMOS transistor, and the drain terminal of the second PMOS transistor is coupled to an output terminal of the output amplifier. The gate terminal of the first NMOS transistor receives a third input voltage signal. The drain and source terminals of the first NMOS transistor are coupled to the drain terminal of the first PMOS transistor and to a negative voltage supply, respectively. The gate terminal of the second NMOS transistor receives a fourth input voltage signal. The drain and source terminals of the second NMOS transistor are coupled to the amplifier output terminal and to the negative voltage supply, respectively.

The output amplifier, in accordance with the present invention, is fast, operable at relatively low voltage supplies, consumes less power than output amplifiers known in the art and generates an output voltage capable of substantially reaching the limits of the positive and the negative voltage supplies.

In some embodiments of the present invention, the output amplifier receives the four voltage signals developed in the last stage of a cascade of sense amplifiers disposed in the data read path of a memory array to generate an output voltage signal representative of the data stored in the decoded memory cell.

DETAILED DESCRIPTION

Figure 2:
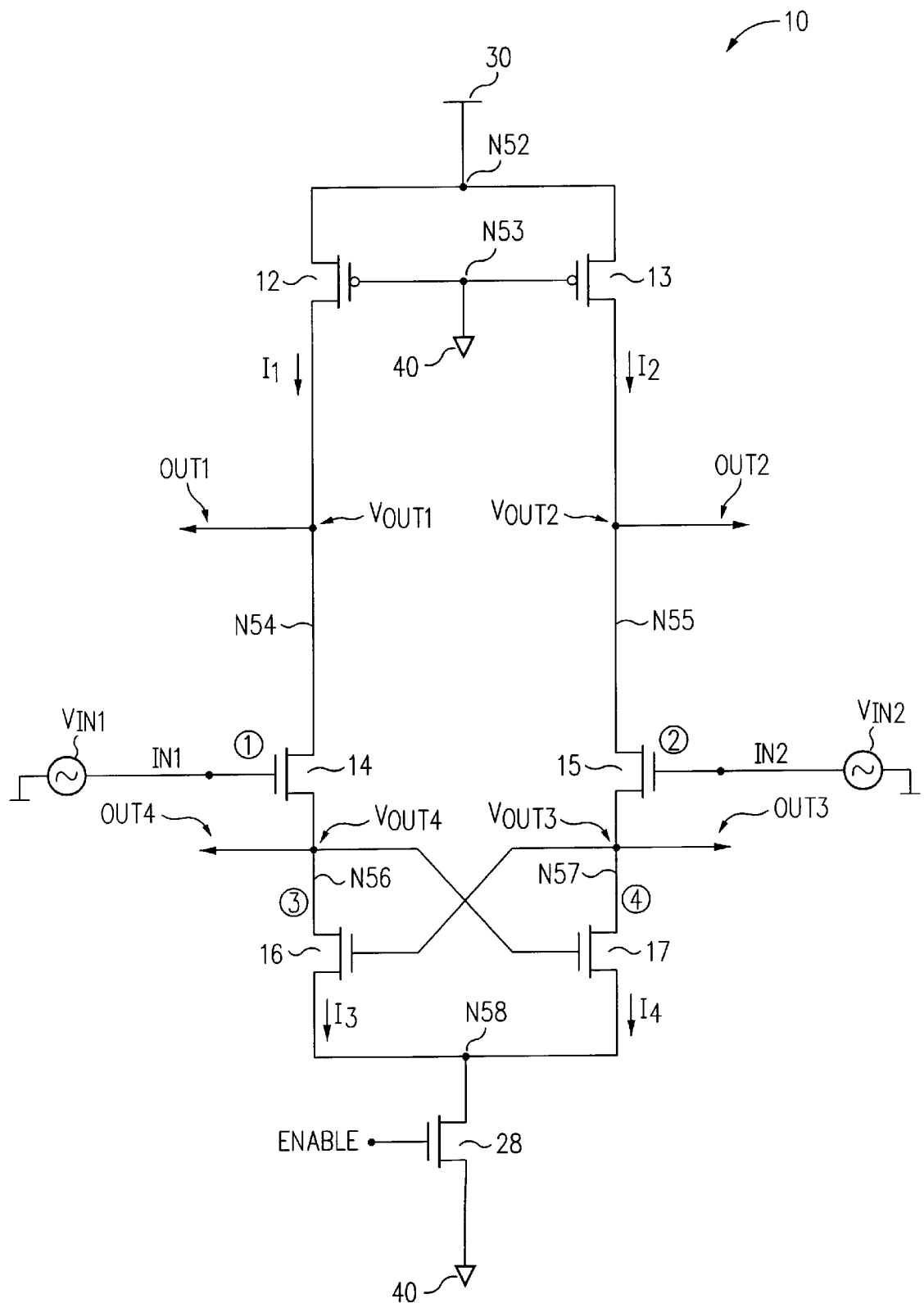
FIG. 2 illustrates a differential sense amplifier in accordance with a first embodiment of the present invention.

FIG. 2 illustrates a sense amplifier 10, in accordance with one embodiment of the present invention. Sense amplifier 10 includes four NMOS (N-channel MOS) transistors 14, 15, 16 and 17 as well as two PMOS (P-channel MOS) transistors 12 and 13.

PMOS transistors 12 and 13 provide resistive loads between transistor 14 and voltage supply 30 and between transistor 15 and voltage supply 30, respectively, and, as such, may be replaced with resistors. A fifth NMOS transistor 28 may be employed to enable or disable sense amplifier 10, and may have its channel dimensions and its gate-to-source voltage selected to limit the current consumed by amplifier 10. In some embodiments of the present invention, the gate terminals of PMOS transistors 12 and 13 are coupled to receive an enabling signal to enable or disable sense amplifier 10. Alternatively, a PMOS power gating transistor (not shown in FIG. 2) may be disposed between the voltage supply 30 and the source terminals of transistors 12 and 13. Accordingly, hereinafter any reference to a positive or a negative voltage supply is understood to optionally include either an enabling PMOS transistor or an enabling NMOS transistor, or both, to apply or inhibit the voltage supply, and/or to limit the current consumed by the amplifier.

The gate terminals of PMOS transistors 12 and 13 are connected to node N53 which is connected to the negative voltage supply, i.e. system ground terminal 40. The source terminals of transistors 12 and 13 are connected to node N52 which is connected to the positive voltage supply terminal 30. The drain terminals of transistors 12 and 13 are connected to nodes N54 and N55, respectively. The drain and source terminals of NMOS transistor 14 are connected to nodes N54 and N56, respectively. The gate terminal of transistor 14 is coupled to input terminal IN1 for receiving the first input voltage signal $V_{IN1}$ applied to sense amplifier 10. The drain and the source terminals of NMOS transistor 15 are connected to nodes N55 and N57, respectively. The gate terminal of transistor 15 is coupled to input terminal IN2 for receiving the second input voltage signal $V_{IN2}$ applied to sense amplifier 10. The gate, drain and source terminals of NMOS transistor 16 are connected to nodes N57, N56 and N58, respectively. The gate, drain and source terminals of NMOS transistor 17 are connected to nodes N56, N57 and N58, respectively. The drain and source terminals of NMOS transistor 28 are connected to nodes N58 and system ground, node 40, respectively. The gate terminal of transistor 28 is connected to an enabling signal ENABLE, or to a bias voltage to limit current consumed by the amplifier, especially at high operating voltage.

Output terminal OUT1 connected to the drain terminal of transistor 14 provides the first output voltage signal $V_{OUT1}$ and output terminal OUT2 connected to the drain terminal of transistor 15 provides the second output voltage signal $V_{OUT2}$ of sense amplifier 10. Output terminal OUT3 connected to the source terminal of transistor 15 provides the third output voltage signal $V_{OUT3}$, and output terminal OUT4 connected to the source terminal of transistor 14 provides the fourth output voltage signal $V_{OUT4}$ of amplifier 10. In most instances, output voltage signals $V_{OUT4}$, $V_{OUT3}$ of the amplifier are not delivered to any other stage.

As seen from FIG. 2, since the drain terminal of transistor 16 is coupled to the gate terminal of transistor 17 and the drain terminal of transistor 17 is coupled to the gate terminal of transistor 16, transistors 16 and 17 form a cross-coupled configuration.

In order for sense amplifier 10 to detect and continuously amplify (i.e. amplify without latching) voltage signals $V_{IN1}$ and $V_{IN2}$, applied to input terminals IN1 and IN2, respectively, the aspect ratio W/L (the ratio of transistor channel width, W, to transistor channel length, L) of transistor 14 must be greater than that of transistor 16; similarly, the aspect ratio of transistor 15 must be greater than that of transistor 17. For high speed performance, all transistors in the preferred embodiment use the minimum channel length allowed by the fabrication technology. Also, in the preferred embodiment, transistors 14 and 15 have identical geometries as do transistors 16 and 17. Therefore, the widths of transistors 14 and 15 exceed those of transistors 16 and 17.

In the operation of sense amplifier 10, if the input voltage signals $V_{IN1}$ and $V_{IN2}$ are equal, the amplifier is in a balanced condition causing nodes N56 and N57 to be at the same voltage potential. Starting from this balanced condition, assume input voltage $V_{IN1}$ increases in voltage. If the voltage signals at nodes N57 and N58 were to remain constant, the gate-to-source voltage of saturated transistor 16 would remain unchanged, resulting in a constant current through transistor 16. Because the same current flows through both transistors 14 and 16, the saturated current through transistor 14 would also remain constant, requiring the gate-to-source voltage of transistor 14 to remain constant. Therefore, any increase in signal $V_{IN1}$ would result in a similar increase in the voltage level at node N56 (neglecting body effect). However, as the voltage level at node N56 rises, the gate-to-source voltage of transistor 17 increases, increasing the current flow through transistor 17. The increase in current through transistor 17 decreases the voltage at node N57, thus reducing the current through transistor 16 which, in turn, causes the voltage level at node N56 to rise even more. This feedback mechanism continues until a new equilibrium is reached at which the voltage at node N56 increases by an amount greater than the increase in voltage signal $V_{IN1}$. The increased current through transistor 17 also flows through transistors 15 and 13, resulting in an increase in the voltage drop across transistor 13 and a decrease in the voltage level at node N55. Similarly, the reduced current through transistor 16 causes the voltage level at node N54, to increase. To determine the voltage gain of sense amplifier 10, the following exemplary equations are developed.

The voltages at output terminals OUT4 and OUT3 are equal to $V_{OUT4}$ and $V_{OUT3}$, respectively. The currents flowing through transistors 14, 15, 16, 17 are $I_1$, $I_2$, $I_3$, and $I_4$ respectively. The channel widths of transistors 14–17 are equal to $W_{14}$, $W_{15}$, $W_{16}$ and $W_{17}$, respectively. Assume that transistors 14–17 have the same short channel length and the same threshold voltages $V_T$. It is known that, unlike long channel transistors whose saturated drain currents are governed by the square-law relationship, short channel NMOS transistors, because of electron velocity saturation, exhibit a reasonably linear relationship between their saturated drain currents and their gate-to-source voltages. Therefore, assuming that each of transistors 14–17 operates in its respective saturation region, has zero body effect, and has a current proportional to the channel width of the transistor and also proportional to the gate-to-source voltage minus one threshold voltage, it can be seen by inspection that:

$$I_1 = K^* W_{14}^* (V_{IN1} - V_{OUT4} - VT) \quad \text{(i)}$$

$$I_2 = K^* W_{15}^* (V_{IN2} - V_{OUT3} - V_T) \quad \text{(ii)}$$

$$I_3 = K^* W_{16}^* (V_{OUT3} - V_{N58} - V_T) \quad \text{(iii)}$$

$$I_4 = K^* W_{17}^* (V_{OUT4} - V_{N58} - V_T) \quad \text{(iv)}$$

Where K is a proportionality constant and is assumed to be identical for transistors 14–17. It is noted that equations (i–iv) are approximations only. Since transistors 14–17 operate in their respective saturation regions, their respective drain currents are independent from their respective drain-to-source voltages.

In steady state, the current flowing through transistor 14 also flows through transistor 16, therefore, currents $I_1$ and $I_3$ have equal magnitudes, and, likewise, currents $I_2$ and $I_4$ have equal magnitudes. It follows that:

$$W_{14}^*(V_{IN1} - V_{OUT4} - V_T) = W_{16}(V_{OUT3} - V_{N58} - V_T) \quad (1)$$

$$W_{15}(V_{IN2} - V_{OUT3} - V_T) = W_{17}(V_{OUT4} - V_{N58} - V_T) \quad (2)$$

In the preferred embodiment, transistor 15 has the same channel width as transistor 14 and transistor 17 has the same channel width as transistor 16. Therefore, $W_{15} = W_{14}$ and $W_{17} = W_{16}$.

If $W_{14}$ is substituted for $W_{15}$, and $W_{16}$ is substituted for $W_{17}$ in equations (1) and (2), and then equation (2) is subtracted from equation (1), the following equation is obtained:

$$W_{14}(V_{IN1}-V_{OUT4}-V_{IN2}+V_{OUT3})=W_{16}(V_{OUT3}-V_{OUT4}) \quad (3)$$

After regrouping:

$$W_{14}(V_{IN1}-V_{IN2})=(W_{14}-W_{16})(V_{OUT4}-V_{OUT3}) \quad (4)$$

The differential voltage gain from inputs terminals IN1, IN2 to output terminals OUT4, OUT3 of sense amplifier 10 is determined by:

$$A_v=(V_{OUT4}-V_{OUT3})/(V_{IN1}-V_{IN2}) \quad (5)$$

Therefore, from equations (4) and (5) it is seen by inspection that:

$$A_v=(W_{14})/(W_{14}-W_{16}) \quad (6)$$

In other words, the differential voltage gain from the input terminals IN1 and IN2 to the output terminals OUT4 and OUT3 of sense amplifier 10 is determined by the ratio of the channel width of transistor 14 to the difference between the channel widths of transistors 14 and 16. For example, if transistors 14 and 15 have channel widths of 4.0 $\mu$m and transistors 16 and 17 have channel widths of 3.0 $\mu$m, and if transistors 14–17 have the same channel lengths, the differential voltage gain of sense amplifier 10 from input terminals IN1, IN2 to output terminals OUT4, OUT3 is equal to 4/(4−3)=4 (The actual voltage gain is slightly smaller due to body effect which is neglected in the above equations).

Thus, the gain from the differential input terminals IN1, IN2 to the differential output terminals OUT4, OUT3 is easily selected to a desired value. As with all amplifiers, as the voltage gain of amplifier 10 increases, so does the delay across it. Amplifier 10 also has a second pair of differential output terminals, OUT1, OUT2, which are the primary output terminals of the amplifier. The differential voltages between output terminals OUT3 and OUT4 provide differential currents through transistors 16 and 17 which, in turn, provide differential currents through PMOS transistors 12 and 13 (i.e. the load resistors) which consequently result in differential voltages between output terminals OUT1 and OUT2. By varying the channel widths of transistors 12 and 13, the load resistance between terminal OUT1 and voltage supply 30 (i.e. the load resistance of transistor 12) and the load resistance between terminal OUT2 and voltage supply 30 (i.e. the load resistance of transistor 13) is varied.

More specifically, for given transconductances ($\Delta I_{OUT}/\Delta V_{IN}$) of NMOS transistors 16 and 17, and a fixed differential voltage between output terminals OUT3 and OUT4, a fixed differential current flows through NMOS transistors 16 and 17. The current through NMOS transistor 16 also flows through NMOS transistor 14 and PMOS transistor 12. Similarly, the current through NMOS transistor 17 also flows through NMOS transistor 15 and through PMOS transistor 13. Thus the differential currents through transistors 16 and 17 provide differential currents through transistors 12 and 13 which, in turn, provide differential voltages across output terminals OUT1, OUT2, and which are directly proportional to each of the following: 1) the differential voltages across output terminals OUT4, OUT3; 2) the transconductances of NMOS transistors 16 and 17; and 3) the effective resistances of load transistors 12 and 13. If the product of the transconductance of transistor 16 (or 17) and the resistance of transistor 12 (or 13) were equal to unity, the differential voltage across output terminals OUT1 and OUT2 would be equal to the differential voltage across output terminals OUT4 and OUT3. However, by increasing the resistances of load transistors 12 and 13 or by increasing the transconductances of the NMOS transistors 16, 17, the voltage gain across output terminals OUT1, OUT2 is increased to a value greater than that across output terminals OUT4, OUT3. Thus the voltage gain from input terminals 1NI, 1N2 to output terminals OUT1, OUT2 is easily selected to be less than, approximately equal to, or greater than the voltage gain from input terminals IN1, IN2 to output terminals OUT4 and OUT3.

Note that as the voltage at input terminal IN1 goes up, the voltage at output terminal OUT4 goes up by an even greater amount; the voltage at output terminal OUT3 goes down; the current through NMOS transistor 16 decreases; the current through PMOS transistor 12 decreases, and the voltage at output terminal OUT1 increases. In particular, as the voltage level at input terminal IN1 increases, the voltage levels at both output terminals OUT4 and OUT1 also increase.

An important advantage of sense amplifier 10 is that it provides negative capacitances at its input terminals IN1 and IN2. For example, assume that the voltage Gain $A_v$, as defined in equation (5) above, is 4.0, and that the resistances of transistors 12 and 13 are chosen such that the voltage gain from input terminals IN1, IN2 to output terminals OUT1, OUT2 is also 4. With these voltage gains, if the voltage signal at input terminal IN1 increases by 50 millivolts (mv) and the voltage signal at input terminal IN2 decreases by 50 mv, then the voltage signals at output terminals OUT4 and OUT1 increase by 200 mv, while the voltage signals at output terminals OUT3 and OUT2 decrease by 200 mv. In other words, as the voltage at the gate region, i.e. the first plate of the gate capacitance of transistor 14, increases in voltage by 50 mv, the voltage at the second plate of the capacitor of transistor 14—including that at the source, channel, and drain regions—increases by 200 mv. The 50 mv increase in voltage at the input terminal IN1 results in a 150 mv decrease in the gate-to-source, gate-to-channel and gate-to-drain voltages of transistor 14. Therefore, a negative charge raises the gate voltage of transistor 14; this represents a negative input capacitance. The negative capacitance occurs even if the voltage gain at output terminals OUT1 and OUT2 is low, since almost all the channel capacitance of a saturated MOS transistor exists between the gate and the source regions.

If input terminals IN1 and IN2 are driven from high impedance sources with a step function input, input terminals IN1 and IN2, instead of exponentially approaching their final voltages, actually overshoot their final voltages (due to the negative capacitance). This overshoot speeds up amplifier response.

Another important advantage of sense amplifier 10 is that—with the exception of PMOS transistors 12 and 13 which only provide resistive loads—it has all NMOS 48309 v3 transistors, which inherently have higher gain-bandwidth products than do PMOS transistors.

Advantageously, both the common mode input voltage and the common mode output voltage at output terminals OUT1 and OUT2 of sense amplifier 10 are approximately close to voltage supply 30. Furthermore, with no differential input voltage, each of the voltages $V_{OUT1}$ and $V_{OUT2}$ is greater than the voltage determined by subtracting the threshold voltage of a transistor (i.e. PMOS or NMOS) from the voltage supply 30. In other words, the source-to-drain voltages of PMOS transistors 12 and 13—when no differential input voltage is applied to input terminals IN1 and IN2—are smaller than their respective threshold voltages or the respective threshold voltages of NMOS transistors 14 and 15, which is a significant advantage of sense amplifier 10. This allows NMOS transistors 14 and 15 to remain in their respective saturation regions even when input signals $V_{IN1}$ and $V_{IN2}$ are near the positive voltage supply 30.

The value of the resistance between terminal OUT1 and voltage supply 30 terminal as well as that between terminal OUT2 and voltage supply terminal 30 can be varied by selecting for transistors 12 and 13 different channel widths and channel lengths. Therefore, by varying the channel dimensions, particularly the channel width, of transistors 12 and 13, the differential voltage gain from input terminals IN1, IN2 to output terminals OUT1 and OUT2 can be varied. Transistors 12 and 13 are preferably selected to have minimum channel lengths.

Observe that sense amplifier 10, advantageously, provides three separate mechanisms for varying the differential voltage at output terminals OUT1 and OUT2 for a given differential input voltage. These three mechanisms are: (1) varying the gain of the amplifier from the input terminals IN1, IN2 to output terminals OUT4, OUT3 (see Equation 6); (2) varying the resistance between terminal OUT1 and voltage supply terminal 30 and that between terminal OUT2 and voltage supply terminal 30; and (3) varying the transconductances (i.e. the channel widths) of all NMOS transistors 14, 15, 16, and 17 in the amplifier.

A numerical example describing the operation of sense amplifier 10 follows. Assume that the differential voltage gain from input terminals IN1, IN2 to output terminals OUT4, OUT3 of sense amplifier 10 is equal to 3.0 (i.e., transistors 14 and 15 are each 1.5 times as wide as transistors 16 and 17) and that the voltage supply 30 provides a voltage supply of 2.5 volts. Also assume an NMOS transistor threshold voltage of 0.6 volts. Assume further that sense amplifier 10 is initially in a balanced condition with input voltage signals $V_{IN1}$ and $V_{IN2}$ at 2.1 volts, output voltages $V_{OUT4}$ and $V_{OUT3}$ at 1.3 volts and output voltages $V_{OUT1}$ and $V_{OUT2}$ at 2.1 volts. Finally, assume that node 58 is at 0.4 volts. Based on these assumptions and using equations (i–iv) to calculate currents $I_1, I_2, I_3$ and $I_4$, it is seen that $I_1$ is equal to $I_3$ and $I_2$ is equal to $I_4$.

When $V_{IN1}$ increases by 100 mv to 2.2 volts and $V_{IN2}$ decreases by 100 mv to 2.0 volts, voltage signal $V_{OUT4}$ increases by 300 mv to 1.6 volts, voltage signal $V_{OUT3}$ decreases by 300 mv to 1.0 volts and the voltage level at node 58 remains fixed at 0.4 volts. The above condition represents the maximum differential input voltage for which these equations apply, because based on this condition, the gate-to-source voltages of NMOS transistors 14 and 16 decrease to one threshold voltage and the gate voltage of transistor 17 exceeds its drain voltage by 0.6 volts (i.e. its threshold voltage). With these voltages, currents $I_4$ and $I_2$ are each two times greater than they were in the initially balanced condition, while currents $I_1$ and $I_3$ have decreased to zero. Consequently, the 0.4 volts drop across the source-to-drain terminals of PMOS transistor 13 doubles from its initially balanced condition of 0.4 volts to 0.8 volts. Therefore, the voltage at output terminal OUT2 decreases to 1.7 volts (i.e. 2.5−0.8=1.7). Similarly with currents $I_1$ and $I_3$ equaling zero amps, the voltage across the source-to-drain terminals of PMOS transistor 12 is equal to 0 volts and consequently terminal OUT1 is at 2.5 volts. As mentioned earlier, for a given differential voltage across output terminals OUT4, OUT3 the differential voltage across output terminals OUT1, OUT2 may be increased by increasing the resistances between terminals OUT1, OUT2 and voltage supply 30, (i.e., by decreasing the channel widths of transistors 12 and 13) or by increasing the transconductances of the NMOS transistors 14–17, (i.e. by increasing the channel widths of transistors 14–17). In the above example, the variations in the values of currents $I_1$ and $I_2$ coupled with the values of the resistances provided by transistors 12 and 13 increase the output voltage $V_{OUT1}$ by 400 mv to 2.5 volts and decrease the output voltage $V_{OUT2}$ by 400 mv to 1.7 volts.

In the foregoing numerical example, the differential voltage gain between input terminals IN1, IN2 and output terminals OUT4, OUT3 is equal to 3. The differential voltage gain between input terminals IN1, IN2 and output terminals OUT1, OUT2 is equal to 4. However, by varying the resistances of resistive elements 12 and 13 or the transconductances of transistors 14–17, the differential voltage gain between input terminals IN1, IN2 and output terminals OUT1, OUT2 may be selected to be either equal to, greater than or smaller than the differential voltage gain between input terminals IN1, IN2 and output terminals OUT4, OUT3.

An advantage of sense amplifier 10 is that transistors 14 and 15 may be selected to have relatively small channel dimensions so as to contribute relatively small capacitances to output terminals OUT1 and OUT2. Moreover, when output terminals OUT3 and OUT4 are not used to supply voltage signals to any other stage, the response time at these terminals is very fast since these terminals are isolated from output terminals OUT1 and OUT2, which may be coupled to high capacitive nodes.

Another advantage of sense amplifier 10 is that, as is seen above, both input voltage signals $V_{IN1}$ and $V_{IN2}$ and output voltage signals $V_{OUT1}$ and $V_{OUT2}$ of sense amplifier 10 are maintained at a voltage near the voltage at voltage supply terminal 30. For example, in the numerical example given above, the common mode input voltage of the amplifier is 2.1 volts, and the common mode output voltage of the amplifier at output terminals OUT1, OUT2 is also 2.1 volts. Therefore, the common mode output voltage and the common mode input voltage of sense amplifier 10 are substantially equal, thereby advantageously providing for easy cascading of several stages of sense amplifier 10. This cascading achieves very fast response time when sense amplifier 10 is employed in sensing the voltages generated by memory cells, as is described next.

Figure 4A:
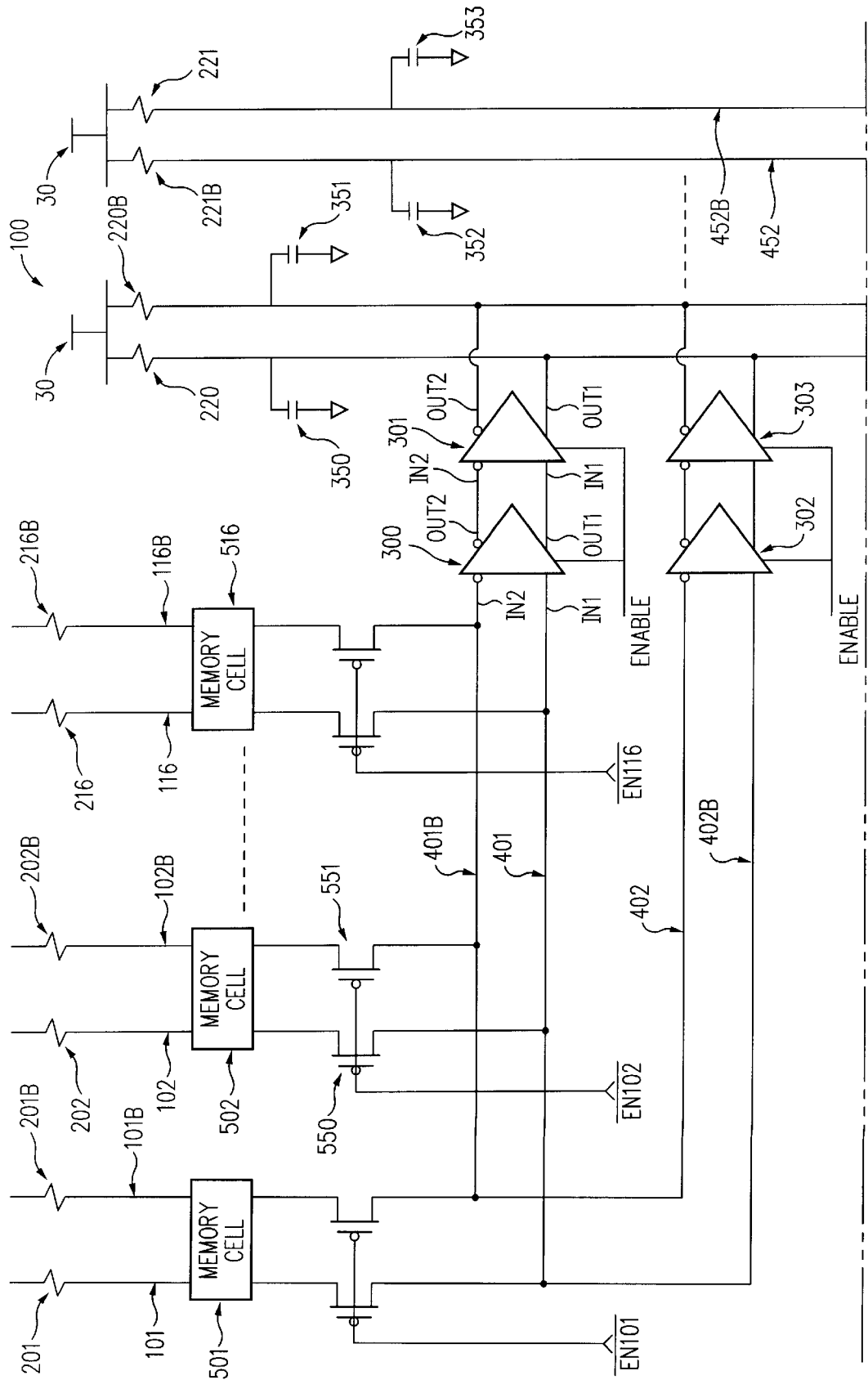
FIG. 4 illustrates an array of memory cells, arranged in a plurality of rows and columns, which includes a two-stage cascade of sense amplifiers, in accordance with the present invention, disposed in the data read path of each of the array's local I/O lines, global vertical I/O lines and global horizontal I/O lines.
Figure 5:
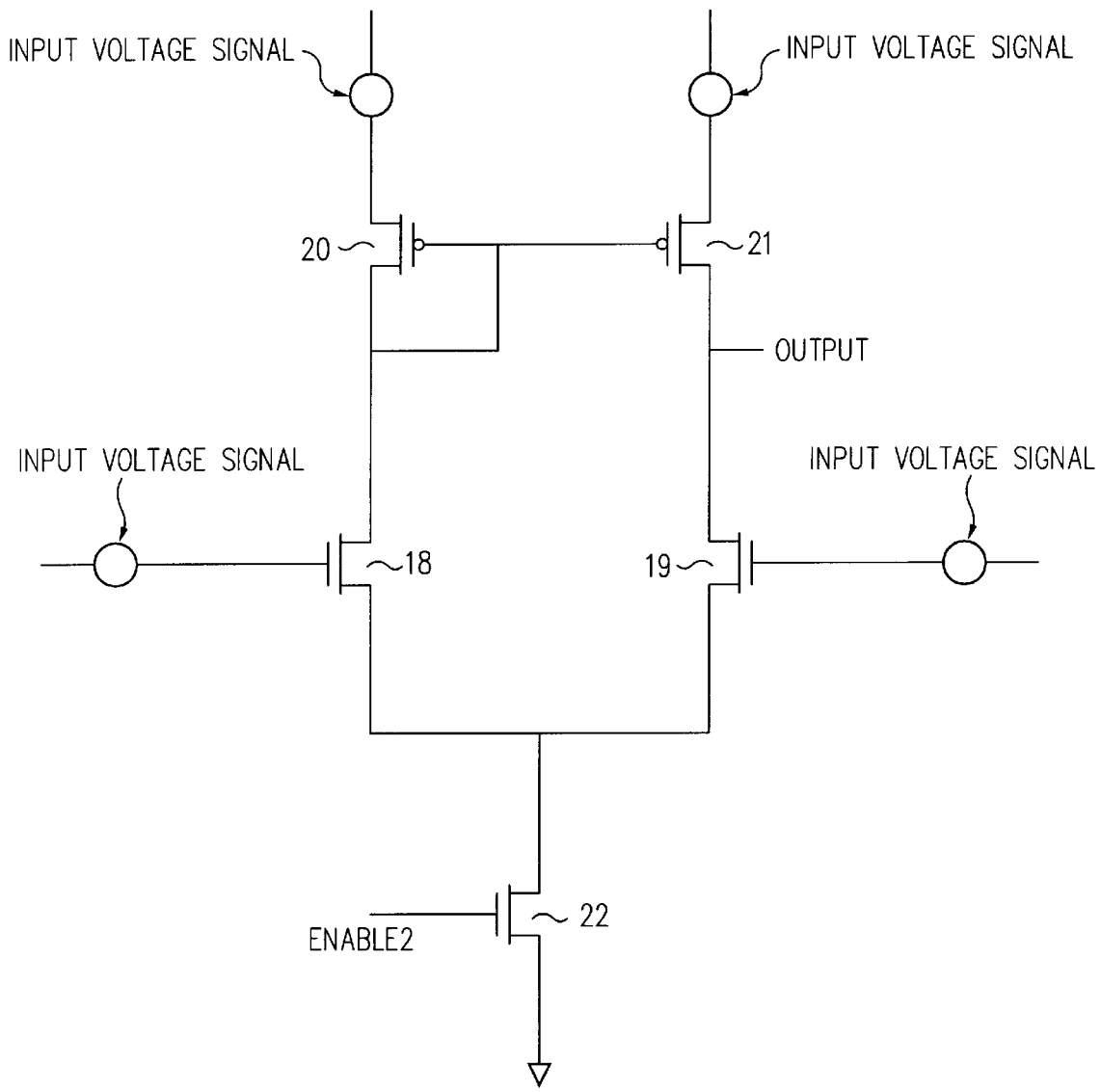
FIG. 5 illustrates an output amplifier, in accordance with one embodiment of the present invention.

By way of an illustrative example, the advantages of sense amplifier 10 when employed in a data read path of a Static Random Access Memory (SRAM) array are described next. FIG. 4 shows an array 100 of SRAM memory cells and sense amplifiers associated with a single bit of data. In a typical memory device, this circuitry would be repeated N times to provide a width of N bits. Array 100 includes 16 true bitlines 101–116 and 16 complement bitlines 101B–116B connected to local I/O (input/output) lines 401 and 401B (only 3 of the true and the complement bitlines are shown in FIG. 2). It is understood that an I/O line may be a bi-directional I/O line or a unidirectional output line. Many SRAM cells (e.g. 256) are connected across each true and complement bitlines. For example, SRAM cell 501 (and other e.g. 255 SRAM cells not shown in FIG. 4) is connected across bitlines 101 and 101B; SRAM cell 502 (along with other cells not shown) is connected across bitlines 102 and 102B, etc. To access an SRAM cell in the memory address space of array 100, both the row and the columns to which the cell is coupled to must first be decoded. No row or column decoding is shown in FIG. 4 as it is unrelated to understanding the present invention, but it is understood that to access a memory cell, a row and a column in the array are decoded. Assume the row containing cells 501, 502, etc. is selected.

Signals $\overline{EN101}$, $\overline{EN102}$ ... $\overline{EN116}$ are output signals generated by a column decoder and each, when selected to be at a low level, connects its addressed column to local I/O lines 401 and 401B. When, for example, signal $\overline{EN102}$ is asserted low to turn on the PMOS select transistors 550 and 551, memory cell 502 is accessed and bitlines 102 and 102B are coupled to local I/O lines 401 and 401B respectively. Local I/O line 401 is connected to input terminal IN1 of sense amplifier 300 and local I/O line 401B is connected to input terminal IN2 of sense amplifier 300. Output terminal OUT1 of sense amplifier 300 is connected to input terminal IN1 of sense amplifier 301 and output terminal OUT2 of sense amplifier 300 is connected to input terminal IN2 of sense amplifier 301. Output terminals OUT1 and OUT2 of sense amplifier 301 are coupled to Global Vertical (GV) I/O lines 451 and 451B, respectively.

Figure 3:
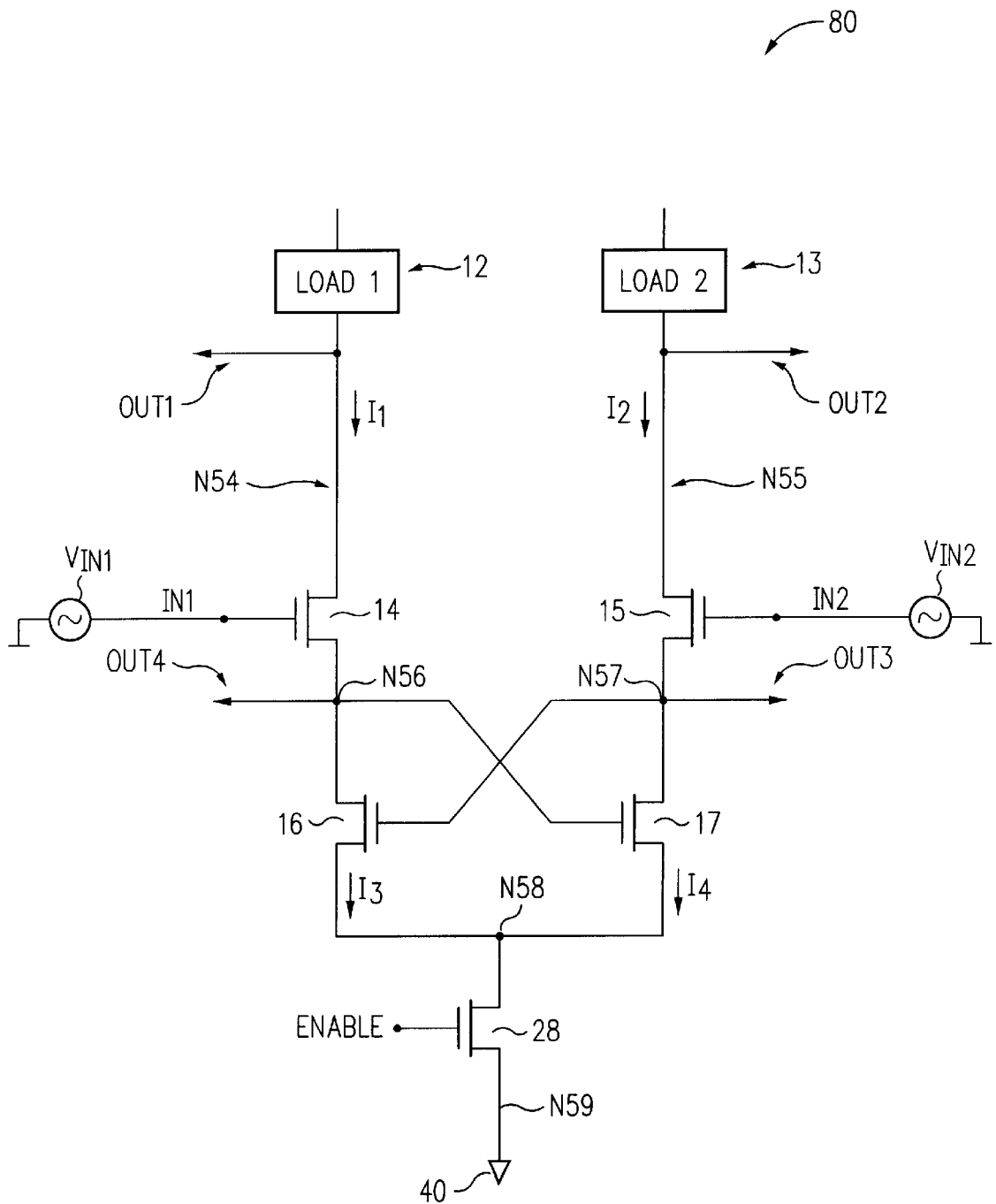
FIG. 3 illustrates a differential sense amplifier in accordance with a second embodiment of the present invention.

FIG. 3 shows sense amplifier 80, in accordance with another embodiment of the present invention. Sense amplifier 80, in some embodiments, has larger channel width transistors than does sense amplifier 10; sense amplifier 80 is otherwise similar in operation to sense amplifier 10 except that load devices 12 and 13 in sense amplifier 80 have very low resistances and may be shared by other sense amplifiers 80.

Referring to FIG. 4, sense amplifier 300 corresponds to sense amplifier 10 of FIG. 2. Sense amplifier 301 corresponds to sense amplifier 80 of FIG. 3. Consequently, in array 100, all sense amplifiers supplying voltage signals to GV lines 451 and 451B, e.g. sense amplifiers 301 and 303, use the same load resistors 220 and 220B—that couple GV lines 451 and 451B to voltage supply terminal 30. Resistor 220 acts as a load device 12 between respective terminals OUT1 and voltage supply terminal 30 for all amplifiers 301, 303, etc. Similarly, resistor 220B acts as a load device 13 between respective terminals OUT2 and voltage supply terminal 30 for all amplifiers 301, 303, etc. The sharing of the load resistors 220 and 220B advantageously minimizes the capacitive contribution of shared load devices 12 and 13 to GV lines 451 and 451B. Terminals OUT3 and OUT4 of sense amplifiers 300 and 301 do not supply signals to any other amplifier in array 100.

As is seen in FIG. 4, many pairs of local I/O lines may be connected to GV lines 451 and 451B (only two of which are shown in FIG. 4), but only one pair of local I/O lines is decoded at any given time. In other words, only one pair of sense amplifiers, 300–301 or 302–303, etc., is enabled for any given address.

GV lines 451 and 451B are coupled to input terminals IN1 and IN2 of sense amplifier 304 whose output terminals OUT1 and OUT2 are coupled to input terminal IN1 and IN2 of sense amplifier 305. Output terminals OUT1 and OUT2 of sense amplifier 305 are coupled to Global Horizontal (GH) I/O lines 453 and 0 453B. As is seen in FIG. 4, many pairs of GV lines may be connected to GH lines 453 and 453B (only two of which are shown in FIG. 4), but only one pair of GV lines is decoded at any given time. In other words, only one of the respective pairs of sense amplifiers 304–305 or 306–307, etc., is enabled to read data from any given address.

Sense amplifier 304 corresponds to sense amplifier 10 of FIG. 2. Sense amplifier 305 corresponds to sense amplifier 80 of FIG. 3. Resistor 222, which couples GH line 453 to voltage supply 30, acts as a load device 12 between respective terminals OUT1 and voltage supply terminal 30 of all sense amplifiers, e.g. 305 and 307, which deliver signals to GH line 453. Similarly, resistor 222B, which couples GH line 453B to voltage supply terminal 30, acts as a load device 13 between respective terminals OUT2 and voltage supply terminal 30 of all sense amplifiers, e.g. 305 and 307, which deliver signals to GH line 453B. Terminals OUT3 and OUT4 of sense amplifiers 304 and 305 do not supply signals to any stage in array 100.

GH lines 453 and 453B are coupled to input terminals IN1 and IN2 of sense amplifier 308 whose output terminals OUT1 and OUT2 are coupled to input terminals IN1 and IN2 of sense amplifier 309. Each of the sense amplifiers 308 and 309 correspond to a sense amplifier 10 as described above and shown in FIG. 2. The voltage signals at output terminals OUT1, OUT2, OUT3 and OUT4 of sense amplifier 309 are applied to input terminals of output amplifier 310. Output amplifier 310 provides a single-ended output voltage signal that switches almost rail to rail. The single-ended output voltage is applied to circuit block 315 which combines this output voltage with other signals (e.g. an output enable signal), buffers the combined voltage and subsequently applies it to output pad 311. Terminals OUT3 and OUT4 of sense amplifier 308 do not deliver signals to any stage in array 100.

In the discussion below it is understood that FIG. 4 illustrates only one example of how a plurality of sense amplifiers 10 and 80 may be disposed in the data read path of a memory array. It is also understood that more or fewer than two stages of signal sensing and amplification may be performed in each of the local I/O lines, GV lines and GH lines. For example, the voltage signals appearing at the output terminals of amplifier 301 may be applied to input terminals of yet another sense amplifier whose output terminals would then be coupled to GV lines 451 and 451B or e.g. the input terminals of amplifier 301 may be directly coupled to local I/O lines 401 and 401B. It is also understood that, depending on the type of the array matrix and the architectural layout chosen, array 100 may include more or less than 16 columns connected to each pair of local I/O lines.

As is well known in the art, an MOS memory cell typically has very small transistor dimensions so as to make possible the inclusion of many such memory cells in a given Integrated Circuit (IC) surface area. The small size of a memory cell limits the amount of current or charge that such a cell can generate. Each of the SRAM memory cells shown in array 100, therefore, generates a very small amount of current during a read operation. Furthermore, to achieve high cell density, the bitlines are typically coupled to many memory cells and therefore have relatively high capacitances. The combination of low current and high capacitance results in a slow development of a differential voltage across the bitlines. To quickly read the data stored in a memory cell, the small differential voltage produced by a memory cell must pass through one or more amplification stages to produce a rail-to-rail voltage signal.

Several important considerations including the voltage gain and the ability to drive a capacitive load of an amplifier must be borne in mind when amplifying small differential signals, as discussed below.

Generally, the higher the gain of a single stage amplifier, the slower is its response time. Therefore, although it may be possible to generate a rail-to-rail output voltage signal using a single stage amplifier that receives a small differential voltage generated by a memory cell, the time required to generate the rail-to-rail voltage signal may become prohibitively long, rendering the amplifier undesirable. To optimize the speed at which data stored in a memory cell is read, it is typically desirable to amplify the differential input voltage signal in many stages, with each amplification stage driving a low capacitance load and providing a voltage gain of e.g. approximately 3.0. However, there exist high capacitance lines along the signal paths and, furthermore, the transistor threshold voltage sets an upper limit on the output voltage signals that can be generated from each amplification stage, which limit is imposed to maintain the amplifier transistors in their respective saturation regions for optimum performance. In sense amplifier 10, if the differential voltage across terminals OUT3 and OUT4 exceeds an NMOS threshold voltage, e.g. 0.6 volts, transistor 16 or 17 exits its respective saturation region, a condition which must be avoided to achieve the highest possible speed.

GV lines 451 and 451B are typically long lines, and consequently have undesirably high capacitances, e.g. 1 picofarad (pf) each. GV lines 451 and 451B which are driven by a differential current source from amplifier 301 or 303, etc., and are coupled to voltage supply 30 by resistive loads 220, 220B, have an exponential response to a step function current input with a time constant of RC, where R is the resistance of load resistors 220 or 220B and C is the inherent capacitance of GV lines 451 or 451B which are respectively shown as capacitors 350 and 351 in FIG. 4. If amplifier stages 300, 304 and 308, etc. each have a propagation delay of 0.1 ns, the RC delay of GV lines 451 and 451B should also preferably be equal to 0.1 ns. Thus, assuming that C has a fixed value of 1 pf, resistors 220 and 220B are each selected to have a resistance of 100 ohms, so that the RC time constant of each of GV lines 451 and 451B is 0.1 ns.

The amount of differential current flowing from amplifier 301 or 303 into resistors 220, 220B is preferably kept small to limit the power consumption. The minimum acceptable differential current is determined by the resistance R of resistors 220, 220B and the worst-case offset voltage (e.g. 10 to 20 mv) of e.g. amplifier 304. To overcome the offset voltage, a differential voltage signal of e.g. 50 mv is preferably required across the input terminals IN1, IN2 of sense amplifier 304. To achieve a 50 mv signal across 100 ohm load resistors 220, 220B, a differential current of 0.5 milliamp (ma) flows through these resistors. The current consumed by sense amplifier 301 is proportional to the width of its transistors 14–17 and 28. The width of transistor 28 is selected such that a current of 0.5 ma flows therethrough. Transistors 14–17 are selected wide enough so as to steer most of the current through either load resistor 220 or load resistor 220B—with the maximum expected input differential voltage—to generate the desired differential output voltage. Consequently, because the resistance of each resistor 220, 220B is 100 ohms and the current flowing through transistor 28 of sense amplifier 301 is selected to be 0.5 ma, a differential voltage of up to 50 mv is developed across output terminals OUT1, OUT2 of sense amplifier 301 (i.e. across terminals IN1 and IN2 of sense amplifier 304.)

To set forth the advantages and aid in understanding sense amplifier 10 when it is used in the data read path of memory array 100, concurrent references to FIGS. 2, 3 and 4 are made below.

Assume that during a read operation, a word line (not shown) coupling to memory cells 501, . . . , 516 is enabled and signal $\overline{EN102}$ goes to a low level, coupling bitlines 102 and 102B to local I/O lines 401 and 401B. The decoded memory cell 502, generates a current of e.g. 100 microamps through either bitline resistor 202 or through bitline resistor 202B, thus generating a differential voltage across the input terminals IN1 and IN2 of sense amplifier 300. To achieve sufficient differential input voltage (i.e. 50 mv) to overcome the assumed 10 mv input offset voltage of amplifier 300, resistors 202, 202B are selected to be 500 ohms each. Thus a differential voltage of 50 mv is generated across the input terminals of sense amplifier 300 (500 ohms×100 microamps=50 mv). Because the load resistances of bitlines 102 and 102B are selected to be 500 ohms each, to achieve a bitline time constant of 0.1 nanosecond, the capacitance of the bit line is selected to be 0.2 pf. This requirement limits the maximum number of memory cells connected to each pair of true and complement bitlines, e.g. bitlines 102 and 102B.

The channel widths of transistors 14–17 in amplifier 300 are selected such that the voltage gain from input terminals IN1, IN2 to output terminals OUT4, OUT3 of sense amplifier 300 is equal to 3.0. With 50 mv differential voltage applied to input terminals IN1 and IN2, the differential voltage across terminals OUT4 and OUT3 of sense amplifier 300 is 150 mv. The channel dimensions (resistance) of PMOS transistors 12 and 13 are selected such that the differential voltage across output terminals OUT1 and OUT2 of sense amplifier 300 is 200 mv. In other words, sense amplifier 300 provides a differential voltage gain of 3.0 between its input terminals IN1, IN2 and its output terminals OUT4, OUT3 and a differential voltage gain of 4.0 between its input terminals IN1, IN2 and its output terminals OUT1, OUT2.

The 200 mv differential voltage developed across output terminals OUT1 and OUT2 of sense amplifier 300 are subsequently applied to the input terminals IN1 and IN2 of sense amplifier 301. Sense amplifier 301 delivers output signals to GV lines 451 and 451B each of which is a relatively long line thereby causing each to have an undesirably high capacitance, e.g. 1 pf. In order to keep the time constant of GV lines 451 and 451B approximately equal to that of a sense amplifier delay, e.g. 100 picoseconds (ps), resistors 220 and 220B are each selected to have a resistance of 100 ohms, hence an RC time-constant of 100 ps. In order to maintain the differential voltage across the input terminals of sense amplifier 304 well above the amplifier input offset voltage, e.g. 10 mv, a differential voltage of 50 mv is desired across GV lines 451 and 451B. Therefore, sense amplifier 301 delivers current I1 of 500 microamps through resistor 220 or a current I2 of 500 microamps through resistor 220B to generate a differential voltage of 50 mv across input terminals IN1 and IN2 of sense amplifier 304. Consequently, sense amplifier 301 receives a differential voltage of 200 mv across its input terminals IN1 and IN2 and generates (1) a 600 mv differential voltage across its output terminals OUT4 and OUT3; and (2) a 50 mv differential voltage across its high capacitance output terminals OUT1 and OUT2.

Depending on the memory array size and the memory array architecture, many sense amplifiers could be coupled to GV lines 451 and 451B (only two of which, 301 and 303, are shown in FIG. 2), therefore, it is desired to minimize the capacitive contribution of sense amplifiers 301 and 303 to GV lines 451 and 451B. The generation of a 600 mv differential voltage across the gate terminals of transistors 16 and 17 of sense amplifier 301 allows transistors 14 and 15 of sense amplifier 301 to provide the necessary differential current and, at the same time, to have relatively small channel widths, thereby, advantageously minimizing the capacitive contribution of output terminals of a plurality of sense amplifiers, e.g. 301, 303, to GV lines 451 and 451B.

The 50 mv differential voltage developed across GV lines 451 and 451B is applied to the input terminals of sense amplifier 304, which generates a voltage differential of 150 mv across output terminals OUT4 and OUT3 and a voltage differential of 200 mv across its output terminals OUT1 and OUT2.

The 200 mv differential voltage developed across output terminals OUT1 and OUT2 of sense amplifier 304 is applied to the input terminals IN1 and IN2 of sense amplifier 305. Sense amplifier 305 delivers output signals to GH lines 453 and 453B each of which has an undesirably high capacitance, e.g. 2 pf. In order to keep the time constant of GH lines 453 and 453B approximately equal to that of a sense amplifier delay, e.g. 100 ps, resistors 222 and 222B are each selected to have a resistance of 50 ohms, hence an RC time-constant of 100 ps. In order to maintain the differential voltage across the input terminals of sense amplifier 308 above the amplifier input offset voltage, e.g. 10 mv, a differential voltage of 50 mv is desired across GH lines 453 and 453B. Therefore, with an input differential voltage of 200 mv, sense amplifier 305 delivers current I1 of 1 ma through 50 ohm resistor 222 or a current I2 of 1 ma through 50 ohm resistor 222B to generate a differential voltage of 50 mv across input terminals IN1 and IN2 of sense amplifier 308. Consequently, sense amplifier 305 receives a differential voltage of 200 mv across its input terminals IN1 and IN2 and generates a differential voltage of 600 mv across its output terminals OUT4, OUT3 and a differential voltage of 50 mv across its output terminals OUT1, OUT2.

Depending on the memory array size and the memory array architecture, many sense amplifiers could be coupled to GH lines 453 and 453B (only two of which, 305 and 307, are shown in FIG. 4), therefore, it is desired to minimize the capacitive contribution of sense amplifiers 305 and 307 to GH lines 453 and 453B. The generation of relatively large 600 mv across output terminals OUT4 and OUT3 of sense amplifier 305 allows transistors 14 and 15 of sense amplifier 305 to provide the desired differential output current and, at the same time, allows transistors 14 and 15 to have reasonably small channel widths, advantageously minimizing the capacitive contribution of output terminals of a plurality of sense amplifiers, e.g. 305, 307, to GH lines 453 and 453B.

Amplifiers 301 and 305 preferably have relatively larger transistor channel widths than amplifiers 300 and 304 thereby to provide relatively high differential output currents necessary to establish adequate differential voltages across low resistance loads (e.g. resistors 220, 220B), as discussed above.

Amplifiers 300, 304 and 308 preferably have small transistor channel widths to conserve IC area (and hence cost), to save power, and to improve speed. The improvement in speed resulting from small transistor channel widths in amplifiers 300, 304 and 308 stems from the fact that these amplifiers drive negative capacitances, as discussed above. As the channel widths of all the transistors in amplifiers 300, 304, 308 decrease, less current is consumed and the resistances of transistors 12 and 13 increase in each of these amplifiers. The resulting increase in output impedance, combined with the negative input capacitance presented by the succeeding amplifier stage (e.g. 301, 305), improve the speed of the cascaded amplifiers.

The 50 mv differential voltage developed across GH lines 453 and 453B is applied to the input terminals of sense amplifier 308, which generates a voltage differential of 200 mv across its output terminals OUT1 and OUT2 which are delivered to the input terminals of sense amplifier 309.

Unlike sense amplifiers 301 and 305 which drive high-capacitance lines coupled to voltage supplies by low resistance loads, sense amplifiers 308 and 309 are not coupled to high capacitance lines. Accordingly, load resistors 12 and 13 of sense amplifiers 308 and 309 each have a high resistance (e.g. 2 kilo-ohms), enabling sense amplifiers 308 and 309 to provide the desired voltage gain using small NMOS transistors which consume smaller currents. Sense amplifier 309 is physically disposed adjacent output amplifier 310. Sense amplifier 309 provides a differential voltage gain of 3.0 between its input terminals IN1, IN2 and its output terminals OUT4, OUT3 and a voltage gain of 4.0 between its input terminals IN1, IN2 and its output terminals OUT1, OUT2. Accordingly, the differential voltage developed across output terminals OUT4, OUT3 of sense amplifier 309 is 600 mv, while that across output terminals OUT1, OUT2 of sense amplifier 309 is 800 mv. As is seen from FIG. 4, both pairs of differential output voltages of sense amplifier 309 are subsequently delivered to two pairs of differential input terminals of output stage amplifier 310.

In order for transistors 16 and 17 of sense amplifier 10 (FIG. 2) to remain in their respective saturation regions, the differential voltage across terminals OUT4 and OUT3 of the amplifier must not exceed the threshold voltage of an NMOS transistor. Therefore, sense amplifier 10 is incapable of providing a rail-to-rail output voltage without having at least one of its transistors 14–17 exit from its saturation region. What is thus needed is an output stage amplifier capable of receiving the 600 mv and/or 800 mv differential voltages developed across the output terminals of sense amplifier 309 and delivering a substantially rail-to-rail output voltage signal.

Output amplifier 310 of FIG. 4 receives the 600 mv differential voltage developed across output terminals OUT4, OUT3 and also receives the 800 mv differential voltage developed across output terminals OUT1, OUT2 of sense amplifier 309 and generates an output voltage signal that reaches within approximately 100 mv of either the positive voltage supply or the negative voltage supply.

Figure 6:
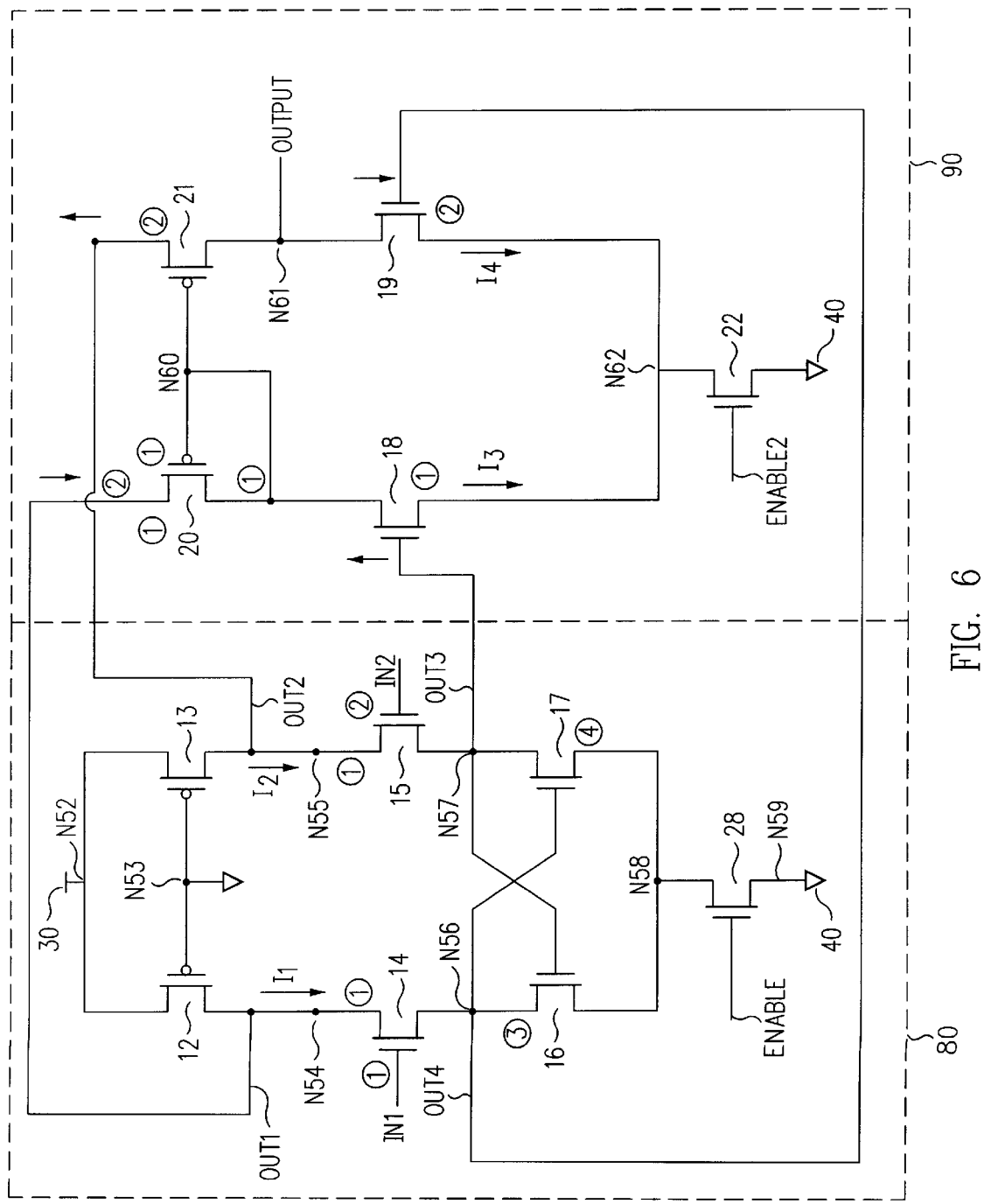
FIG. 6 illustrates the sense amplifier of FIG. 2 coupled to the output amplifier of FIG. 5.

To aid in understanding the operation of output amplifier 310, a transistor level schematic representation of sense amplifier 309 coupled to output amplifier 310 is depicted in FIG. 6. Reference numerals 80 and 90 in FIG. 6 correspond to sense amplifier 309 and output amplifier 310 of FIG. 4, respectively.

Output amplifier 90 includes two matched PMOS transistors 20, 21, two matched NMOS transistors 18, 19 and an NMOS transistor 22, which does not provide any differential signal amplification and only enables or disables output amplifier 90 and/or limits the current consumed by amplifier 90. When signal ENABLE2 goes to a high level, output amplifier 90 is enabled and when signal ENABLE2 goes to a low level, output amplifier 90 is disabled. In some embodiments of the present invention, node N62 of output amplifier 90 may be merged with node N58 of sense amplifier 80, in which case transistor 22 is removed and transistor 28 simultaneously enables or disables both sense amplifier 80 and output amplifier 90.

The gate and drain terminals of PMOS transistor 20 are connected to node N60. The source terminal of transistor 20 is connected to output terminal OUT1 of sense amplifier 80. The source and gate terminals of PMOS transistor 21 are connected to output terminal OUT2 of sense amplifier 80 and to node N60, respectively. The drain terminal of PMOS transistor 21 is connected to output terminal OUTPUT of output amplifier 90. The drain and source terminals of NMOS transistor 18 are connected to nodes N60 and N62, respectively. The gate terminal of transistor 18 is connected to terminal OUT3 of sense amplifier 80. The drain and source terminals of NMQS transistor 19 are connected to output terminal OUTPUT and to node N62, respectively. The gate terminal of transistor 19 is connected to terminal OUT4 of sense amplifier 80. NMOS transistor 22 has a gate terminal that receives signal ENABLE2. The drain and the source terminals of transistor 22 are connected to nodes N62 and system ground 40, respectively. Note that amplifier 80 of FIG. 6 is the same as amplifier 10 of FIG. 2. The operation of output amplifier 90 is described next.

Referring to FIG. 6, if a positive differential voltage, e.g. 200 mv, is applied between the input terminals IN1 and IN2 of sense amplifier 80 (shown in FIG. 4 as sense amplifier 309), a differential voltage of e.g. 600 mv is generated between terminals OUT4 and OUT3 and a differential voltage of e.g. 800 mv is generated between terminals OUT1 and OUT2 of sense amplifier 80.

The high voltage signal on terminal OUT4 is applied to both the gate terminal of transistor 17 of sense amplifier 80 and to the gate terminal of transistor 19 of output amplifier 90, increasing the gate-to-source voltages of both transistors 17 and 19, thereby increasing both currents I2 and I4 (which respectively flow through transistors 17 and 19), all of which currents flow through PMOS transistor 13, thereby reducing the voltage potential on terminal OUT2. At the same time, the decreased voltage signal at terminal OUT3 of sense amplifier 80 decreases the gate-to-source voltages of transistors 16 and 18 thereby decreasing both currents I1 and I3 (which respectively flow through transistors 16 and 18), all of which currents flow through PMOS transistor 12 thereby increasing the voltage potential on terminal OUT1. The drain-to-source voltage of diode-connected PMOS transistor 20 is responsive to the current through transistor 20. For a fixed amount of current I3 through transistor 18, and therefore through transistor 20, an increase in the source voltage of transistor 20 results in a similar increase in the drain and gate voltages of transistor 20.

Figure 1:
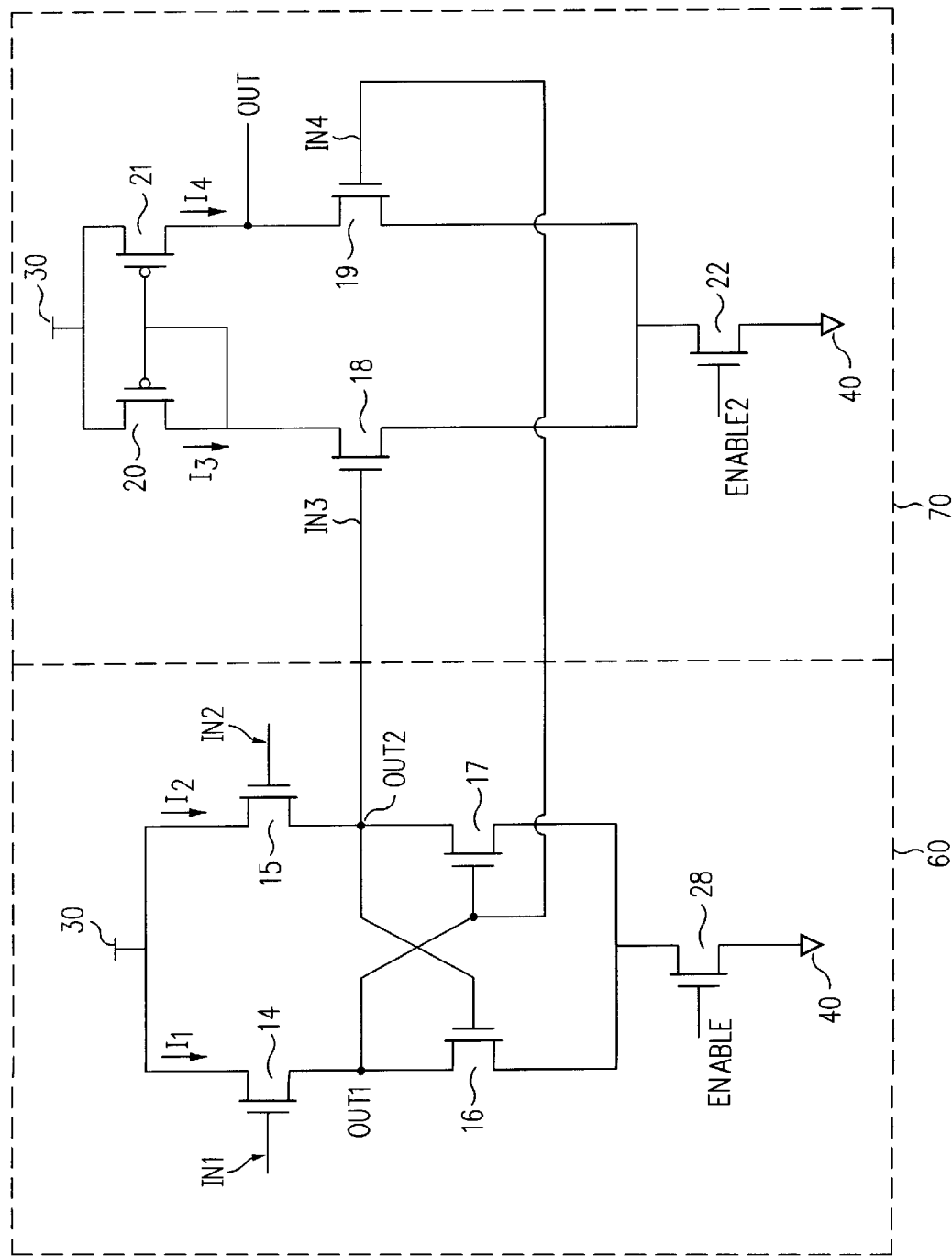
FIG. 1 illustrates a prior art sense amplifier coupled to a prior art output amplifier.

Reference numeral 70 in FIG. 1 illustrates a conventional current mirror differential amplifier in which the source terminals of matched PMOS transistors 20 and 21 are connected to voltage supply Vcc. In amplifier 70, if the gate voltage of NMOS transistor 18 exceeds that of matched transistor 19, the saturated current through transistor 18, and consequently the saturated currents through transistors 20 and 21, exceed that through transistor 19. The output terminal OUT is pulled to a voltage near the voltage supply 30. Amplifier 90 of FIG. 6 provides an improved operation over amplifier 70 of FIG. 1.

Referring to FIG. 6, when terminal OUT4 is at a high voltage level, the currents flowing through transistors 17 and 19 are relatively large, all of which currents flow through transistor 13. Thus, terminal OUT2 is at a particularly low voltage. When terminal OUT4 is at this high voltage, terminal OUT3 is at a low voltage, therefore, the currents through transistors 16 and 18 are both low, both of which currents flow through PMOS transistor 12, therefore, terminal OUT1 is at a high voltage level.

When terminal OUT4 is at this high voltage level, it is desired for the saturated current through NMOS transistor 19 to be as high as possible and that through PMOS transistor 21 to be as low as possible so as to allow output terminal OUTPUT to switch to as low a voltage level as possible and as fast as possible. The relatively low voltage on the source terminal of transistor 21 (i.e. low relative to the high voltage on the source terminal of "current mirror" transistor 20) combined with the high voltage on node N60 (low currents through transistors 12 and 20) lower the magnitude of the gate-to-source voltage of transistor 21 to a level below its threshold voltage, thereby turning off transistor 21. Therefore, with terminal OUT4 at a high voltage level, the high saturated current through transistor 19 relatively quickly lowers the voltage at output terminal OUTPUT because no current is wasted opposing the current through transistor 21.

If, on the other hand, voltage signal IN2 is greater than voltage signal IN1, the reverse happens. Namely, voltage signal OUT4 decreases while voltage signal OUT3 increases. The reduced voltage signal on terminal OUT4 decreases the gate-to-source voltages of both transistors 17 and 19, thereby reducing both currents I2 and I4, flowing respectively through transistors 17 and 19, and thus increasing the voltage potential on terminal OUT2. At the same time, the increased voltage signal at terminal OUT3 of sense amplifier 80 increases the gate-to-source voltages of transistors 16 and 18, thereby increasing both current I1 and I3, flowing respectively through transistors 16 and 18, and thus decreasing the voltage potential on terminal OUT1. Therefore, the voltage signals at the gate and drain terminals of PMOS transistor 20, i.e. node N60, are pulled to a specially low level because of both the decrease in voltage potential at terminal OUT1 and the increase in the magnitude of the gate-to-source voltage of transistor 20 to accommodate the increase in current I3 through transistor 20. Because the gate terminal of PMOS transistor 21 (i.e. node N60) is at a specially low voltage, while the source terminal of PMOS transistor 21 is at a high voltage, PMOS transistor 21 is highly conductive. Concurrently, the reduced voltage potential at terminal OUT4 reduces the current flow through NMOS transistor 19. Therefore, PMOS transistor 21 is in a very strong conducting state, while NMOS transistor 19 is in a weak conducting state. The large differential current relatively quickly increases the voltage signal at output terminal OUTPUT of output amplifier 90 to a voltage that is within 100 mv of the voltage supply 30.

By coupling the source terminals of PMOS transistors 20 and 21 of amplifier 90 to output terminals of amplifier 80—instead of coupling them to a common node such as voltage supply 30, as is known in the art—the current consumption of output amplifier 30 is advantageously reduced, while, simultaneously, the response time of the output amplifier is improved. Referring to FIG. 4, amplifiers 300, 304, 308, 309, and 310 each consume approximately e.g. 0.1 ma of current. Amplifier 301, which drives 1 pf capacitive loads and 100 ohms resistive loads, consumes e.g. 0.5 ma of current. Amplifier 305, which drives 2 pf capacitive loads and 50 ohms resistive loads, consumes e.g. 1.0 ma of current. Consequently, the total current consumed by all the differential amplifiers in the path from bitlines 102 and 102B to the near rail-to-rail swing of output terminal OUTPUT of single-ended output amplifier 310 is about 2 ma. Furthermore, the total delay from assertion of a wordline to the rail-to-rail swing of output terminal OUTPUT of output amplifier 310 is only about 1.0 nanoseconds. This combination of very high speed and low current consumption are advantageously achieved by the cascading of many stages of the sense amplifiers 10, 80 and output amplifier 90, in accordance with the present invention.

The exemplary embodiments of the invention disclosed above are illustrative and not limitative.

The NMOS and PMOS transistors, as used in the above embodiments, are illustrative only. It is obvious to those skilled in the art that e.g. amplifier 10 of FIG. 2, may use PMOS transistors for transistors 14–17 and NMOS transistors (or other resistive elements) for load transistors 12–13, in which case the polarity of all the applied biases are reversed.

Other embodiments of this inventions are obvious to those skilled in the art and are intended to fall within the scope of the appended claims.

I claim:

1. An amplifier comprising:
a first MOS transistor having a gate terminal for receiving a first input signal, a first current carrying terminal coupled to a first output terminal of the amplifier and a second current carrying terminal;
a second MOS transistor having a gate terminal for receiving a second input signal, a first current carrying terminal coupled to a second output terminal of the amplifier and a second current carrying terminal;

a first resistive element having a first terminal coupled to the first output terminal of the amplifier and a second terminal coupled to a first voltage supply;

a second resistive element having a first terminal coupled to the second output terminal of the amplifier and a second terminal coupled to the first voltage supply;

a third MOS transistor having a gate terminal coupled to the second current carrying terminal of the second transistor, a first current carrying terminal coupled to the second current carrying terminal of the first transistor, and a second current carrying terminal coupled to a second voltage supply; and a fourth MOS transistor having a gate terminal coupled to the second current carrying terminal of the first transistor, a first current carrying terminal coupled to the second current carrying terminal of the second transistor, and a second current carrying terminal coupled to the second voltage supply; wherein said amplifier continuously amplifies without latching.

2. The amplifier of claim 1 further comprising a fifth MOS transistor coupled between the second voltage supply and the second current carrying terminals of both the third and the fourth MOS transistors thereby to enable or disable said amplifier.

3. The amplifier of claim 1 further comprising a fifth MOS transistor coupled between the first voltage supply and the second terminals of the first and the second resistive elements thereby to enable or disable said amplifier.

4. The amplifier of claim 1 wherein each of the first, second, third and fourth transistors is an NMOS transistor.

5. The amplifier of claim 1 wherein each of the first, second, third and fourth MOS transistors has a minimum channel length allowed by an MOS fabrication technology.

6. An amplifier comprising:

a first MOS transistor having a gate terminal for receiving a first input signal, a first current carrying terminal coupled to a first output terminal of the amplifier and a second current carrying terminal;

a second MOS transistor having a gate terminal for receiving a second input signal, a first current carrying terminal coupled to a second output terminal of the amplifier and a second current carrying terminal;

a first resistive element having a first terminal coupled to the first output terminal of the amplifier and a second terminal coupled to a first voltage supply;

a second resistive element having a first terminal coupled to the second output terminal of the amplifier and a second terminal coupled to the first voltage supply;

a third MOS transistor having a gate terminal coupled to the second current carrying terminal of the second transistor, a first current carrying terminal coupled to the second current carrying terminal of the first transistor, and a second current carrying terminal coupled to a second voltage supply; and a fourth MOS transistor having a gate terminal coupled to the second current carrying terminal of the first transistor, a first current carrying terminal coupled to the second current carrying terminal of the second transistor, and a second current carrying terminal coupled to the second voltage supply; wherein each of the first, second, third and fourth MOS transistors has a minimum channel length allowed by an MOS fabrication technology and wherein the channel widths of the first and second transistors are greater than the channel widths of the third and fourth transistors respectively.

7. The amplifier of claim 6, wherein each of the first, second, third and fourth MOS transistors operates in a saturation region.

8. The amplifier of claim 4 wherein each of the first and the second resistive elements comprises a PMOS transistor having a source terminal coupled to the first voltage supply and a drain terminal coupled to one of the first and the second output terminals of the amplifier.

9. The amplifier of claim 7 wherein each of the first and the second resistive elements comprises a resistor.

10. The amplifier of claim 8 wherein the voltage signal across the drain-to-source terminal of at least one of the PMOS transistors is smaller than the magnitude of the threshold voltage thereof.

11. The amplifier of claim 10 wherein the common mode input voltage of the amplifier is approximately the voltage of the first voltage supply.

12. The amplifier of claim 11 wherein the common mode output voltage of the amplifier is approximately the voltage of the first voltage supply.

13. An amplifier having first, second, third and fourth output terminals, said amplifier comprising:

a first MOS transistor having a gate terminal for receiving a first input signal, a first current carrying terminal coupled to the first output terminal of the amplifier and a second current carrying terminal coupled to the fourth output terminal of the amplifier;

a second MOS transistor having a gate terminal for receiving a second input signal, a first current carrying terminal coupled to the second output terminal of the amplifier and a second current carrying terminal coupled to the third output terminal of the amplifier;

a first resistive element having a first terminal coupled to the first output terminal of the amplifier and a second terminal coupled to a first voltage supply;

a second resistive element having a first terminal coupled the second output terminal of the amplifier and a second terminal coupled to the first voltage supply;

a third MOS transistor having a gate terminal coupled to the second current carrying terminal of the second transistor, a first current carrying terminal coupled to the second current carrying terminal of the first transistor, and a second current carrying terminal coupled to a second voltage supply; and a fourth MOS transistor having a gate terminal coupled to the second current carrying terminal of the first transistor, a first current carrying terminal coupled to the second current carrying terminal of the second transistor, and a second current carrying terminal coupled to the second voltage supply, wherein said amplifier continuously amplifies without latching.

14. In a memory array comprising a plurality of rows and columns of memory cells, a plurality of differential amplifiers cascaded for sensing and amplifying a small differential voltage signal generated by at least one memory cell of said memory array across a true and a complement bit line of the array, each amplifier comprising:

a first NMOS transistor having a gate terminal for receiving a first input voltage signal of the amplifier, a drain terminal coupled to a first output terminal of the amplifier and a source terminal;

a second NMOS transistor having a gate terminal for receiving a second input voltage signal of the amplifier, a drain terminal coupled to a second output terminal of the amplifier and a source terminal;

a first resistive load coupled between the first output terminal and a first voltage supply;

a second resistive load coupled between the second output terminal and the first voltage supply;

a third NMOS transistor having a gate terminal coupled to the source terminal of the second NMOS transistor, a drain terminal coupled to the source terminal of the first NMOS transistor and a source terminal coupled to a second voltage supply; and a fourth NMOS transistor having a gate terminal coupled to the source terminal of the first NMOS transistor, a drain terminal coupled to the source terminal of the second NMOS transistor and a source terminal coupled to the second voltage supply; wherein said amplifier continuously amplifies without latching.

15. The cascade of amplifiers of claim 14 wherein each amplifier further comprises a fifth NMOS transistor coupled between the source terminals of the third and the fourth NMOS transistors and the second voltage supply, said fifth NMOS transistor thereby enabling and disabling said amplifier by receiving an enabling signal at its gate terminal.

16. The cascade of amplifiers of claim 14 wherein said first and second output terminals of each amplifier supply input signals to a next amplifier in the cascade.

17. The cascade of amplifiers of claim 16 wherein each of the first, second, third and fourth NMOS transistors of each amplifier operates in a saturation region.

18. In a memory array comprising a plurality of rows and columns of memory cells, a plurality of differential amplifiers cascaded for sensing and amplifying a small differential voltage signal generated by at least one memory cell of said memory array across a true and a complement bit line of the array, each amplifier comprising:

a first NMOS transistor having a gate terminal for receiving a first input voltage signal of the amplifier, a drain terminal coupled to a first output terminal of the amplifier and a source terminal;

a second NMOS transistor having a gate terminal for receiving a second input voltage signal of the amplifier, a drain terminal coupled to a second output terminal of the amplifier and a source terminal;

a first resistive load coupled between the first output terminal and a first voltage supply;

a second resistive load coupled between the second output terminal and the first voltage supply;

a third NMOS transistor having a gate terminal coupled to the source terminal of the second NMOS transistor, a drain terminal coupled to the source terminal of the first NMOS transistor and a source terminal coupled to a second voltage supply; and a fourth NMOS transistor having a gate terminal coupled to the source terminal of the first NMOS transistor, a drain terminal coupled to the source terminal of the second NMOS transistor and a source terminal coupled to the second voltage supply, wherein said first and second output terminals of each amplifier supply input signals to a next amplifier in the cascade, wherein each of the first, second, third and fourth NMOS transistors of each amplifier operates in a saturation region wherein the channel widths of first and second transistors are greater than the channel widths of the third and fourth transistors in each amplifier.

19. The cascade of amplifiers of claim 18 wherein the first resistive load of each amplifier comprises a PMOS transistor having a source terminal coupled to the first voltage supply and a drain terminal coupled to the first output terminal of the amplifier and wherein the second resistive load of each amplifier comprises a PMOS transistor having a source terminal coupled to the first voltage supply and a drain terminal coupled to the second output terminal of the amplifier.

20. The cascade of amplifiers of claim 18, said cascade including a first sense amplifier which has a differential voltage gain that is greater than unity, said differential voltage gain defined as the ratio of the differential voltage generated across the first and the second output terminals of the amplifier to the differential voltage applied to the first and the second input terminals of the amplifier.

21. The cascade of amplifiers of claim 20 further comprising a second sense amplifier for delivering a small differential voltage to first true and complement lines of said array each of which lines has a high capacitance, said second sense amplifier receiving the differential voltage signal generated at the first and the second output terminals of said first sense amplifier and providing a differential voltage gain that is smaller than unity.

22. The cascade of amplifiers of claim 21 wherein the differential voltage signal generated between the first and the second output terminals of said second amplifier is approximately equal to the differential voltage applied to the input terminals of said first sense amplifier.

23. The cascade of amplifiers of claim 22 further comprising a third sense amplifier for receiving the differential voltage signal across the first true and complement lines, and in response thereto generating a differential voltage between its first and its second output terminals that is greater than the received differential voltage signal.

24. The cascade of amplifiers of claim 23 further comprising a fourth sense amplifier for delivering a small differential voltage to second true and complement lines of said array each of which lines having a high capacitance, said fourth sense amplifier receiving the differential voltage signal generated at the first and the second output terminals of said third sense amplifier and providing a differential voltage gain that is smaller than unity.

25. The cascade of amplifiers of claim 24 wherein the differential voltage signal generated by the fourth sense amplifier is approximately equal to the differential voltage applied to the first sense amplifier.

26. The cascade of amplifiers of claim 25 further comprising a fifth sense amplifier for receiving the differential voltage across the second true and complement lines of said array, and in response thereto generating a differential voltage between its first and its second output terminals that is greater than the received differential voltage signal.

27. The cascade of amplifiers of claim 26 further comprising a sixth sense amplifier for receiving the differential voltage generated between the first and the second output terminals of said fifth sense amplifier and, in response thereto, generating a differential voltage signal across the first and the second output terminals and which is greater than the received differential signal.

28. An amplifier for receiving a differential input voltage signal and delivering a substantially rail-to-rail output voltage, said amplifier comprising:

a first MOS transistor having a gate terminal for receiving a first input signal of the differential signal;

a second MOS transistor having a gate terminal for receiving a second input signal of the differential signal;

a first resistive element having a first terminal coupled to a first current carrying terminal of the first MOS transistor and a second terminal coupled to a first voltage supply;

a second resistive element having a first terminal coupled to a first current carrying terminal of the second MOS transistor and a second terminal coupled to the first voltage supply;

a third MOS transistor having a gate terminal coupled to a second current carrying terminal of the second transistor, a first current carrying terminal coupled to a second current carrying terminal of the first transistor, and a second current carrying terminal coupled to a second voltage supply;

a fourth MOS transistor having a gate terminal coupled to the second current carrying terminal of the first transistor, a first current carrying terminal coupled to the second current carrying terminal of the second transistor, and a second current carrying terminal coupled to the second voltage supply;

a fifth MOS transistor having a gate terminal coupled to the gate terminal of the third MOS transistor and a first current carrying terminal coupled to the second voltage supply;

a sixth MOS transistor having a gate terminal coupled to the gate terminal of the fourth MOS transistor, a first current carrying terminal coupled to the second voltage supply and a second current carrying terminal coupled to an output terminal of the amplifier for delivering an output voltage that is substantially close to the second voltage supply;

a seventh MOS transistor having a gate terminal and a first current carrying terminal both coupled to a second current carrying terminal of the fifth MOS transistor and a second current carrying terminal coupled to the first current carrying terminal of the first MOS transistor; and an eighth MOS transistor having a gate terminal coupled to the gate terminal of the seventh MOS transistor, a first current carrying terminal coupled to the output terminal and a second current carrying terminal coupled to the first current carrying terminal of the second MOS transistor for delivering an output voltage that is substantially close to the first voltage supply.

29. The amplifier of claim 28 wherein the first, second, third, fourth, fifth and sixth MOS transistors comprise NMOS transistors and wherein the seventh and the eighth MOS transistors comprise PMOS transistors.

30. The amplifier of claim 29 wherein each of said first and second resistive elements comprises a PMOS transistor.

31. The amplifier of claim 28 wherein the first, second, third, fourth, fifth and sixth MOS transistors comprise PMOS transistors and wherein the seventh and the eighth MOS transistors comprise NMOS transistors.

* * * * *